United States Patent
Su et al.

(10) Patent No.: US 6,642,118 B2
(45) Date of Patent: Nov. 4, 2003

(54) METHOD FOR ELIMINATING POLYSILICON RESIDUE BY FULLY CONVERTING THE POLYSILICON INTO SILICON DIOXIDE

(75) Inventors: Chun-Lien Su, Tainan Hsien (TW); Chun-Chi Wang, Nantou (TW); Ming-Shang Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/043,145

(22) Filed: Jan. 14, 2002

(65) Prior Publication Data

US 2003/0143789 A1 Jul. 31, 2003

(51) Int. Cl.[7] .............................................. H01L 21/336
(52) U.S. Cl. ...................... 438/302; 438/303; 438/308; 438/275

(58) Field of Search .......................... 438/200, 302–307, 438/230, 275, 308

(56) References Cited

U.S. PATENT DOCUMENTS

| 5,401,994 A | * | 3/1995 | Adan | ........................ 257/335 |
| 5,488,004 A | * | 1/1996 | Yang | ............................ 437/35 |
| 5,670,406 A | * | 9/1997 | Tseng | ........................ 438/396 |

* cited by examiner

Primary Examiner—Carl Whitehead, Jr.
Assistant Examiner—Yennhu Huynh

(57) ABSTRACT

A method for eliminating polysilicon residue is provided by converting the polysilicon residue into silicon dioxide in two steps. A tilted ion implantation step is performed to implant oxygen ions into the polysilicon residue to rich oxygen containing of the polysilicon residue. An oxygen anneal step is subsequently performed to completely convert the rich oxygen containing polysilicon residue into silicon dioxide that can eliminate the conductivity of the polysilicon residue and prevent oxygen encroachment occurring.

8 Claims, 7 Drawing Sheets

METHOD FOR ELIMINATING POLYSILICON RESIDUE BY FULLY CONVERTING THE POLYSILICON INTO SILICON DIOXIDE

FIELD OF THE INVENTION

The present invention relates to a method of fabricating a semiconductor memory device, and more particularly to a method for eliminating polysilicon residue between two adjacent word lines.

BACKGROUND OF THE INVENTION

Memory technology has progressed considerably in recent years. Since the operational speed and the manipulation data amount of a central processing unit (CPU) is increasing, the performance of a memory cell is increasing at the same time. For example, high speed erasing is a popular method for improving the performance of a memory. Volatile storage memories, such as random access memories (RAM), are widely used in computer nowadays. However, the stored data in RAM vanishes while the power is broke off. Another nonvolatile storage memories, such as mask read only memory (Mask ROM), erasable programmable ROM (EPROM), or electrically erasable programmable ROM (EEPROM) will not lost the stored messages when power dismissed and will be better for some specific usage.

Flash memories are also a nonvolatile storage memory, which has similar structure than conventional EEPROMs. They have a very high erasing speed feature in either an overall region or a local region thereof, and therefore they are very popularly applied in the computer field. For example, they are used to replace the read-only memories to store the firmware such as BIOS (basic input/output system). The users can easily update their BIOS by rewriting the flash memory.

Conventional flash memory cells have a double or triple layer of polysilicon structure. The first polysilicon layer is patterned to form the floating gates, and the second polysilicon layer is patterned to form the control gates and the word lines of the structure. A third polysilicon layer is patterned as select gates to form the triple layer polysilicon structure.

In the process of fabricating flash memory cells, the first polysilicon layer is patterned by photolithography and etching technology to form a plurality of parallel lines. The second polysilicon layer is subsequently formed and patterned to form a plurality of parallel lines to serve as the control gates and the word lines of the structure that is perpendicular to the first polysilicon lines. While forming the control gates, the portion of underlying first polysilicon lines between two word lines is also removed until exposing the substrate to form the floating gates. However, in the procedure of etching the first polysilicon lines, since the anisotropic etching limitation, the removed portion of the first polysilicon lines is not completed and portion of the polysilicon is remained on the sidewall of the insulating layer. This results in circuit short between word lines because of the polysilicon residue connection, and therefore data can not be access to the memory.

SUMMARY OF THE INVENTION

The present invention provides a method for eliminating polysilicon residue, which can convert polysilicon residue into silicon dioxide to be an insulating material, thereby prevent circuit short problem.

In one aspect, the present invention provides a method for eliminating polysilicon residue on a sidewall. The method comprises the following steps. A tilted ion implantation step is performed to implant oxygen ions into the polysilicon residue on the sidewall. An oxygen anneal step is performed to fully convert the polysilicon residue into a silicon dioxide. The silicon dioxide has higher resistivity than the polysilicon so that the silicon dioxide can insolate the adjacent word lines and prevent circuit short.

In another aspect, the present invention provides a method for eliminating polysilicon residue adapted for a semiconductor substrate including a plurality of parallel word lines, the polysilicon residue is on the sidewall of an insulating layer between two word lines and connected the word lines. The method comprises the following steps. A tilted ion implantation step is performed to implant oxygen ions into the polysilicon residue on the sidewall. An oxygen anneal step is performed to fully convert the polysilicon residue into a silicon dioxide.

In another aspect, the present invention also provides a method of fabricating a semiconductor memory device. The method at least comprises the following steps. A gate oxide layer, a first polysilicon layer and a nitride layer are formed on a semiconductor substrate, and the nitride layer, the first polysilicon layer and the gate oxide layer are then patterned. An insulating layer is formed over the semiconductor substrate. A portion of the insulating layer is removed until exposing the nitride layer, and then the nitride layer is removed. A second polysilicon layer is formed on the first polysilicon layer and adjacent portion of the insulating layer. A dielectric layer, a third polysilicon layer and a conductive layer are formed over the semiconductor substrate. The conductive layer, the third polysilicon layer and the dielectric layer are patterned to form a plurality of parallel word lines, and a polysilicon residue is therefore formed on the sidewall of the insulating layer between the word lines. A tilted ion implantation step is performed to implant oxygen ions into the polysilicon residue. An oxygen anneal step is performed to convert the polysilicon residue into a silicon dioxide.

The method for eliminating the polysilicon residue of the present invention not only fully converts the polysilicon residue into the silicon dioxide to isolate the word lines, but also prevents oxygen encroachment caused by over oxidation and lowers thermal budget.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention provides a method for eliminating polysilicon residue, which can fully convert the polysilicon residue on the sidewall into a silicon dioxide to prevent circuit short between adjacent word lines, and also can prevent encroachment problem caused by over oxidation.

Figure 1A:
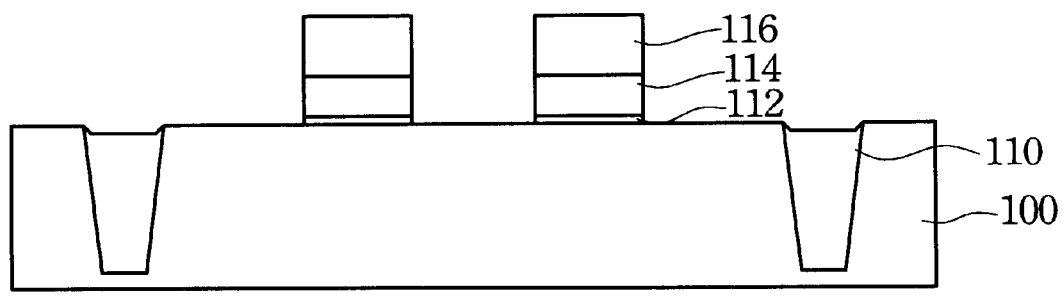
FIGS. 1A–1I are schematic, cross-sectional views of the preferred embodiment of the present invention.

FIGS. 1A–1I are schematic, cross-sectional views of the preferred embodiment of the present invention. Referring to FIG. 1A, a semiconductor substrate 100 such as a p-type doped silicon substrate with <100> lattice structure. An isolating structure 110 is fabricated in the substrate 100 to layout the active regions for each memory cell. The isolating structure 110 can be a field oxide layer formed by LOCOS method, and preferably be a shallow trench isolation (STI) structure.

A gate oxide layer 112, a first polysilicon layer 114 and a nitride layer 116 are formed in sequence on the substrate 100. The gate oxide layer 112 can be formed by thermal oxidation technology with a thickness of about 30–150 angstroms. The first polysilicon layer 114 can be formed by low pressure chemical vapor deposition (LPCVD) at a temperature of about 600–650° C. with a thickness of about 500–1500 angstroms. The first polysilicon layer 114 also can be a doped polysilicon layer. The nitride layer 116 can be formed by CVD with a thickness of about 1100–2400 angstroms. The stacked layer that including the gate oxide layer 112, the first polysilicon layer 114 and the nitride layer 116 is then patterned by conventional photolithography and etching technology to define desired pattern. Undesired portions of the stacked layer are removed to form a plurality of first linear stacked layer, as shown in FIG. 1A.

Figure 1B:
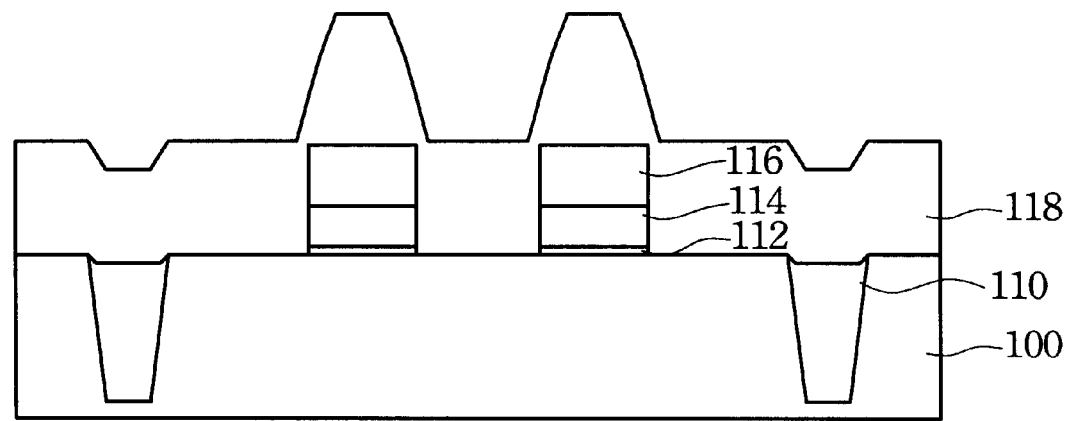
Figure 1C:
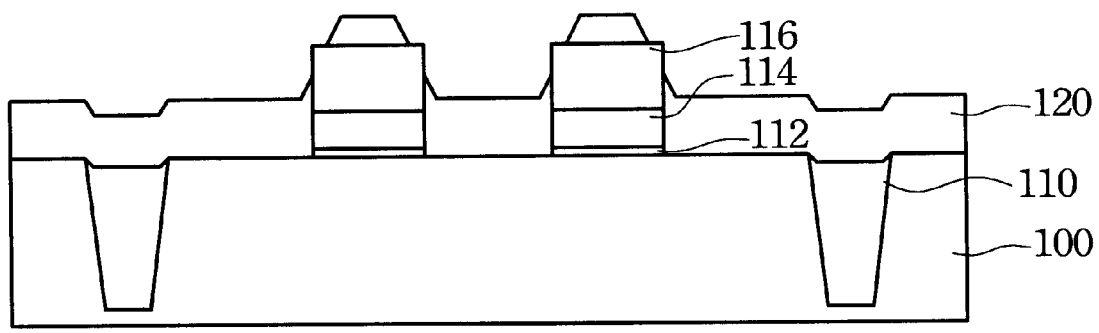

Referring to FIG. 1B, an insulating layer 118, such as an oxide layer, is formed over the substrate 100. The insulating layer 118 is preferably a HDP oxide layer with a thickness of about 1.5–3.5 kilo-angstroms formed by high density plasma chemical vapor deposition (HDP-CVD) of which mainly depositing in vertical direction to obtain a dense structure. Referring to FIG. 1C, portion of the insulating layer 118 is removed until remaining a desired thickness of the insulating layer 120. The resulting insulating layer 120 has a thickness little larger than the thickness of the first polysilicon layer 114, and can be a thickness of about 0.5–2 kilo-angstroms. The insulating layer 120 can be formed by wet dip etching with time control to obtain desired thickness. The insulating layer 120 also can be formed by reactive ion etching (RIE). The top corner of the nitride layer 116 is exposed when the insulating layer 120 is formed.

Figure 1D:
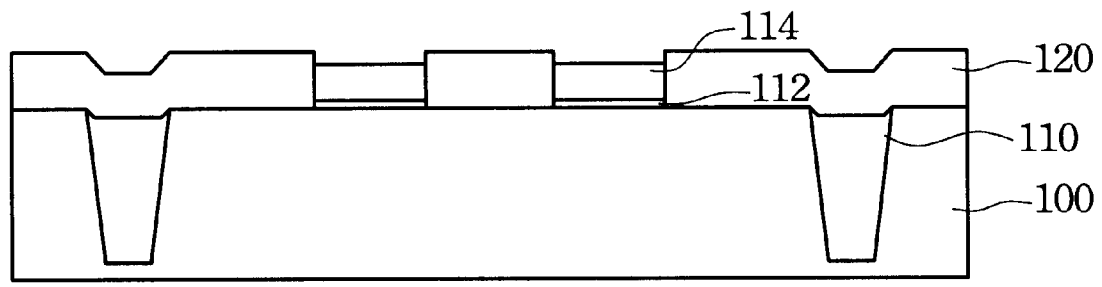
Figure 1E:
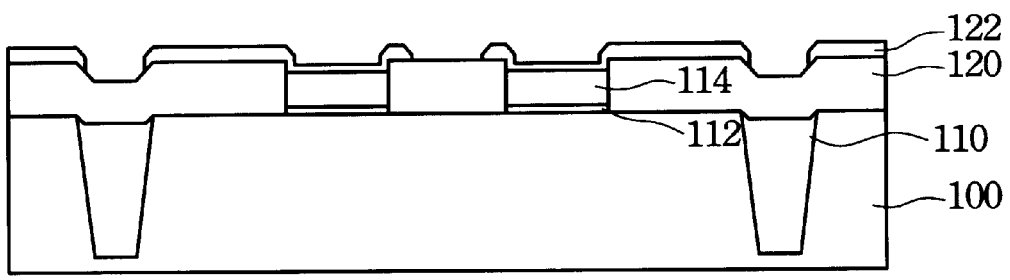

Referring to FIG. 1D, the nitride layer 116 and portion of the insulating layer thereon is removed by such as high selective wet etching to prevent damage on other exposed region. Referring to FIG. 1E, a second polysilicon layer 122 is formed on the first polysilicon layer 114 and the adjacent portion of the insulating layer 120. The second polysilicon layer 122 expands the area of the first polysilicon layer 114 and increases the coupling radio. The second polysilicon layer 122 can be formed with exemplary steps of depositing a polysilicon layer over the substrate 100 and then patterning the polysilicon by photolithography and etching technology to prevent electrically connection to adjacent portions of the first polysilicon layer 114.

Figure 1F:
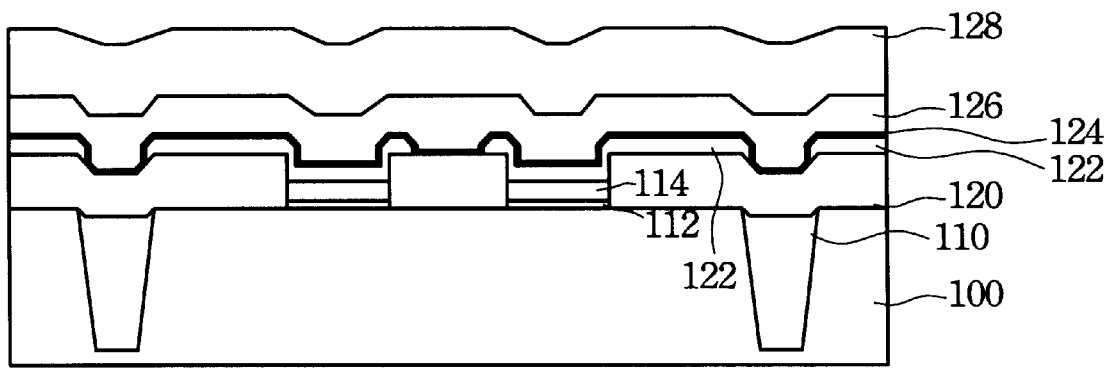

Referring to FIG. 1F, a dielectric layer 124, a third polysilicon layer 126 and a conductive layer 128 are formed in sequence over the substrate 100. The dielectric layer 124 is a layer located between the floating gate and control gate, and preferably, an ONO layer of which stacked with an oxide layer, a nitride layer and an oxide layer. The dielectric layer 124 can has a thickness of about 50–250 angstroms. The third polysilicon layer 126 on the dielectric layer 124 can be formed by CVD. The conductive layer 128 is preferably made of a material of tungsten silicide ($WSi_x$), and can be formed by CVD.

Figure 1G:
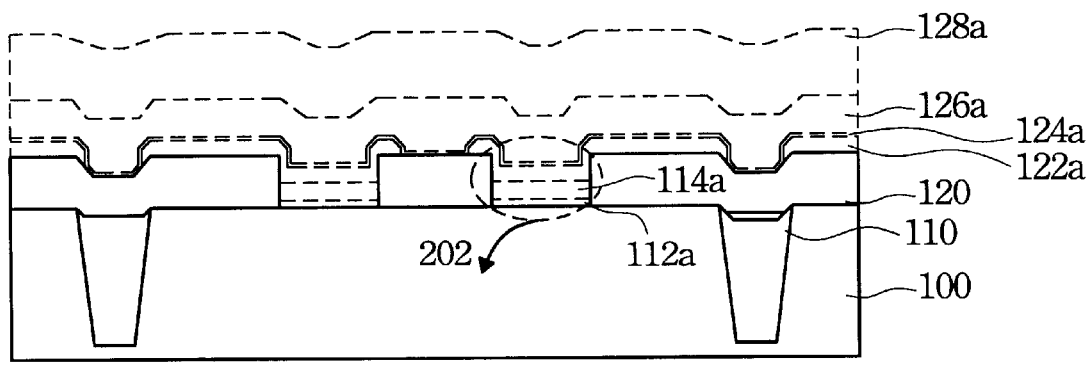

Referring to FIG. 1G, the stacked layer including the dielectric layer 124, the third polysilicon layer 126 and the conductive layer 128 is defined and patterned by conventional photolithography and etching technology to form a plurality of parallel second linear stacked layer to serve as control gates, i.e. word lines. The second linear stacked layer is perpendicular to the first linear stacked layer having the first polysilicon layer 114. The above structure can be formed with following exemplary steps. A photoresist layer (not shown) is formed on the conductive layer 128, and then defined to get desired pattern by conventional photolithography technology. The underlying exposed portions of the conductive layer 128, third polysilicon layer 126, dielectric layer 124, second polysilicon layer 122, first polysilicon layer 114 and gate oxide layer are then etched in sequence by anisotropic dry etching technology, such as reactive ion etching, with the patterned photoresist layer as a mask. The word lines having a conductive layer 128a, a third polysilicon layer 126a, a dielectric layer 124a, a second polysilicon layer 122a, a first polysilicon layer 114a and a gate oxide layer 112a are therefore formed. The patterned photoresist layer is then removed. The linear first polysilicon layer 114 is etched in above steps and only remains block regions under the word lines to serve as floating gates.

Figure 2:
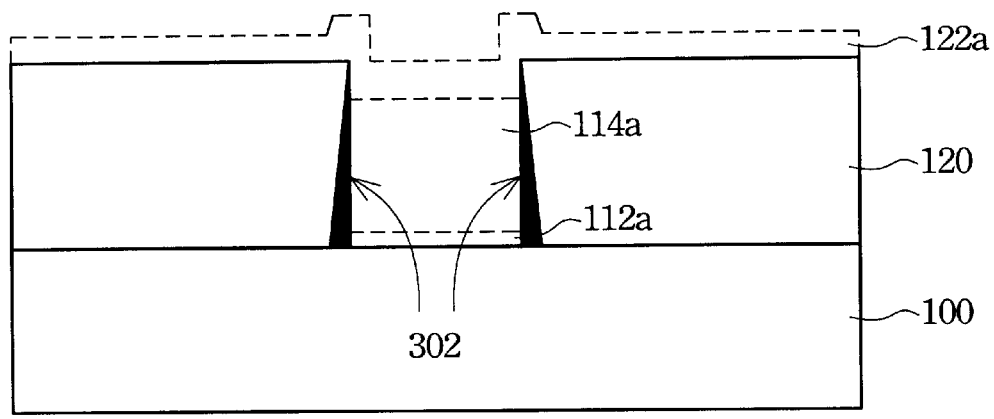
FIG. 2 is a local enlargement of area 202 in FIG. 1G.

In the process of fabricating word lines, since the anisotropic dry etching is performed in a vertical direction, portions of the first polysilicon layer 114 are remained on the sidewall of the insulating layer 120 which is a polysilicon residue. FIG. 2 is a local enlargement of area 202 in FIG. 1G. Referring to FIG. 2, during forming the first linear stacked layer, it is difficult to obtain rectangular top corner. The edge angle of the first linear stacked layer is about 85–88 degrees. Moreover, since the limitation of etching direction while forming the second linear stacked layer, the polysilicon residue 302 is easily remained on the sidewall. The polysilicon residue 302 will cause a circuit short between two adjacent word lines and thus affect the operation of memory.

Figure 3:
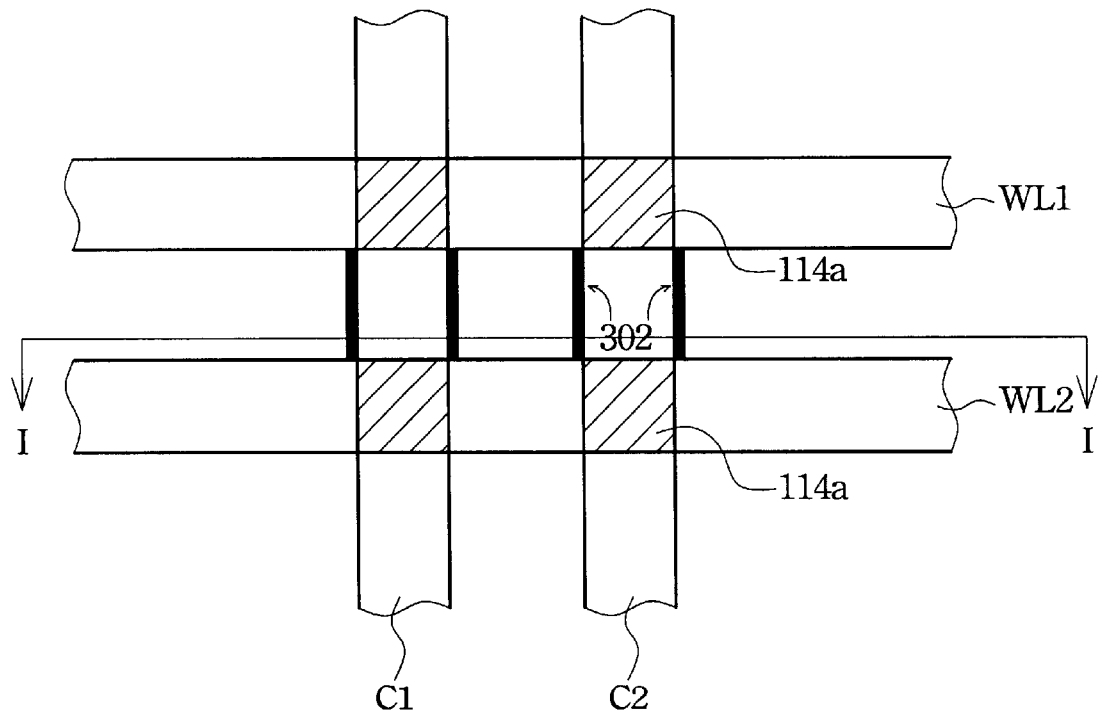
FIG. 3 is a top view corresponding to FIG. 1G.
Figure 4:
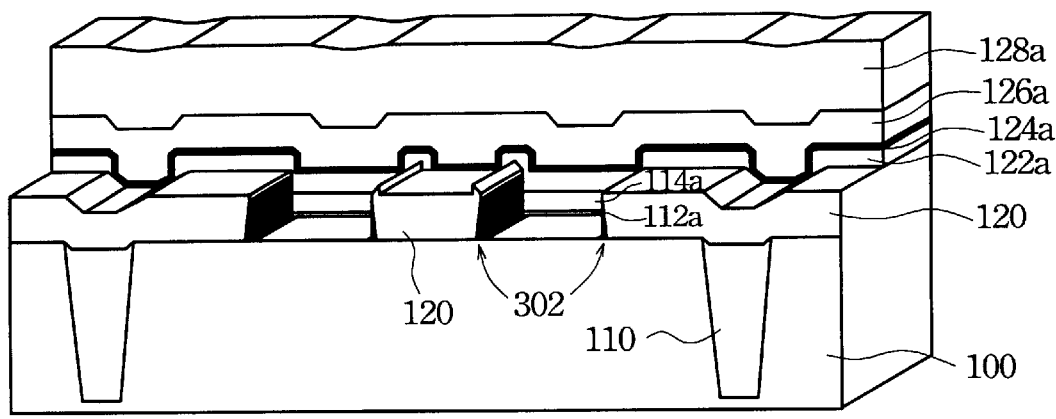
FIG. 4 is a perspective view corresponding to FIG. 1G.

FIG. 3 is a top view corresponding to the cross-sectional line I—I of FIG. 1G. Word lines WL1 and WL2 are formed in foregoing steps. The word lines WL1 and WL2 intersect channel regions C1 and C2 in floating gate block regions, i.e. the first polysilicon layer 114a in FIG. 1G. The polysilicon residue 302 is attached on the sidewall of the insulating layer 120 between the word lines WL1 and WL2. FIG. 4 illustrates a perspective view corresponding to FIG. 1G to clearly indicate the location of the polysilicon residue 302. Referring to FIG. 1G, 3 and 4, the polysilicon residue 302 electrically connects the word lines WL1 and WL2, this causes voltage instability during operating the word lines WL1 and WL2, even resulting data accessing error. In order to solve the problem, the polysilicon residue 302 is converted into silicon dioxide ($SiO_2$) directly by thermal oxidation conventionally. The silicon dioxide is an insulating material and thus the electrically connection problem can be solved. However, if the polysilicon is directly oxidized, the sidewall of the first, second and third polysilicon layers 114a, 122a and 126a will be encroached by oxygen so that the resistivity of the polysilicon layers 114a, 122a and 126a are increased. This will result in the memory device operating more unstably.

Figure 1H:
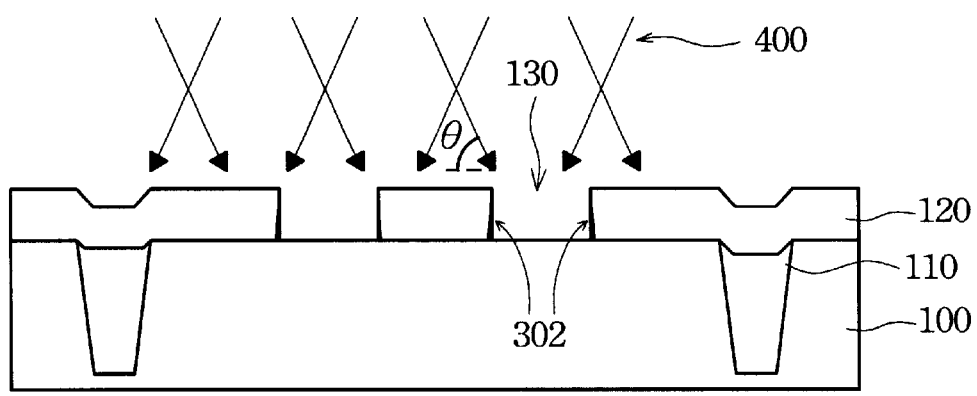
Figure 1:
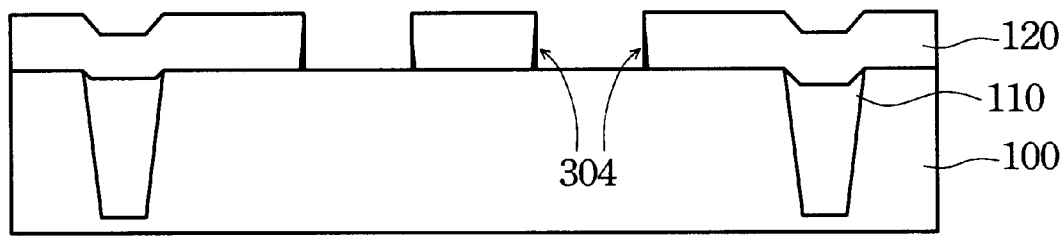

The method of eliminating the polysilicon residue of the present invention utilizes two steps. Referring to FIG. 1H, a tilted ion implantation step 400 is performed. Oxygen ions are implanted into the polysilicon residue 302 in the tilted ion implantation step 400 to rich oxygen containing of the polysilicon residue 302. In the process of tilted ion implantation, the tilted angle θ, i.e. the angle between the implanting direction and substrate surface, is at about 20–70 degrees, and preferably at about 50–65 degrees. The tilted angle θ is determined with the aspect radio of the openings 130 between two portions of the insulating layer 120. The larger of the aspect radio of the openings 130 so that the larger of the tilted angle θ.

Figure 5:
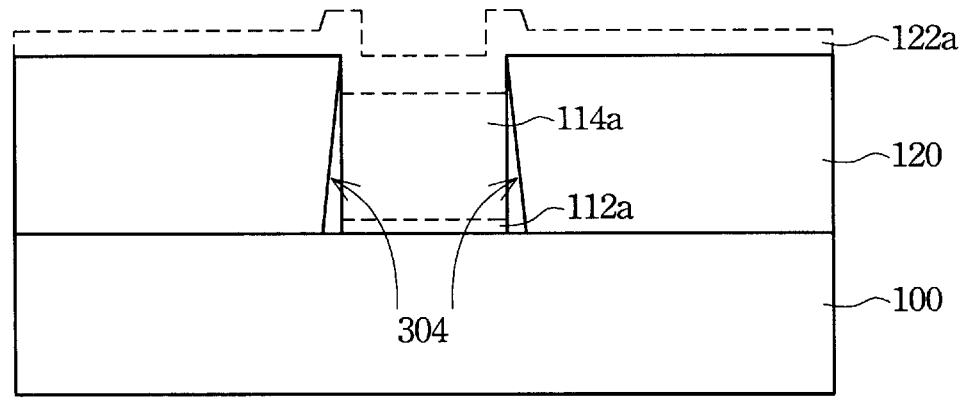
FIG. 5 is a local enlargement of area 204 in FIG. 1I.

Referring to FIG. 1I, an oxygen anneal step is subsequently performed. Oxygen is induced into the reaction chamber and reacts with the polysilicon residue 302. Since the polysilicon residue 302 contains rich oxygen, the polysilicon residue 302 can be easily achieve fully reacting state so that the polysilicon residue 302 can be completely converted into silicon dioxide with fine stoichiometry, as shown in FIG. 5, so that the polysilicon residue 302 can be eliminated. The silicon dioxide can be an insulating material because it has high resistivity greatly larger than polysilicon. Therefore, the problem of circuit short causing from the polysilicon residue 302 can be solved. Furthermore, since the oxygen ions are implanted into the polysilicon residue 302 before oxygen anneal step, using little heat energy can completely convert the polysilicon residue 302 into silicon dioxide. This reduces the thermal budget, and prevents oxygen encroachment because of long oxidation so that the memory device can be more stable.

According to above description, the method for eliminating polysilicon residue of the present invention can completely eliminate the polysilicon residue on the sidewall of insulating layer between two word lines by fully converting the polysilicon residue into silicon dioxide. Moreover, the oxygen encroachment will not be occurred, and the method can reduce thermal budget and have high process stability. The present invention just provides a preferred embodiment to describe the method for eliminating polysilicon residue on the sidewall. The method also can be applied to other places to convert polysilicon on the sidewall into silicon dioxide. Furthermore, the method can be applied to other products, such as Mask ROM, or other similar products.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for eliminating polysilicon residue on a sidewall, comprising the steps of:

performing a tilted ion implantation step to implant oxygen ion into the polysilicon residue on the sidewall; and performing an oxygen anneal step to fully convert the polysilicon residue into a silicon dioxide.

2. The method according to claim 1, wherein the location of the polysilicon residue comprises on the sidewall of an insulating layer between word lines.

3. The method according to claim 1, wherein the tilted angle in the step of tilted ion implantation is about 20–70 degrees.

4. The method according to claim 1, wherein oxygen is induced into the reaction chamber during the oxygen anneal step.

5. A method for eliminating polysilicon residue adapted for a semiconductor substrate including a plurality of parallel word lines, the polysilicon residue is on the sidewall of an insulating layer between two word lines and connected the word lines, comprising the steps of:

performing a tilted ion implantation step to implant oxygen ions into the polysilicon residue on the sidewall; and performing an oxygen anneal step to fully convert the polysilicon residue into a silicon dioxide.

6. The method according to claim 5, wherein each word line includes at least one polysilicon layer and the polysilicon residue is connected to the polysilicon layers of two adjacent word lines.

7. The method according to claim 5, wherein the tilted angle in step of tilted ion implantation is about 20–70 degrees.

8. The method according to claim 5, wherein oxygen is induced into the reaction chamber during the oxygen anneal step.

* * * * *